(12) United States Patent
Furuya

(10) Patent No.: US 9,454,080 B2
(45) Date of Patent: Sep. 27, 2016

(54) SPIN TREATMENT APPARATUS

(71) Applicant: Shibaura Mechatronics Corporation, Yokohama-shi (JP)

(72) Inventor: Masaaki Furuya, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 35 days.

(21) Appl. No.: 14/491,065

(22) Filed: Sep. 19, 2014

(65) Prior Publication Data

US 2015/0083038 A1 Mar. 26, 2015

(30) Foreign Application Priority Data

Sep. 25, 2013 (JP) ................. 2013-198094
Aug. 8, 2014 (JP) ................. 2014-162096

(51) Int. Cl.
| *B05C 13/02* | (2006.01) |
| *B05C 11/02* | (2006.01) |
| *G03F 7/16* | (2006.01) |
| *G03F 7/30* | (2006.01) |
| *G03F 7/42* | (2006.01) |
| *H01L 21/687* | (2006.01) |

(52) U.S. Cl.
CPC ............. *G03F 7/162* (2013.01); *G03F 7/3021* (2013.01); *G03F 7/42* (2013.01); *H01L 21/68728* (2013.01)

(58) Field of Classification Search
USPC .................. 118/500, 52, 612, 56, 319, 320
See application file for complete search history.

(56) References Cited

U.S. PATENT DOCUMENTS 5,989,342 A * 11/1999 Ikeda .................. B05C 11/08
  118/319
2008/0127888 A1* 6/2008 Kim ................ H01L 21/68742
  118/52

FOREIGN PATENT DOCUMENTS

JP          10-135314          5/1998

* cited by examiner

*Primary Examiner* — Yewebdar Tadesse
(74) *Attorney, Agent, or Firm* — Oblon, McClelland, Maier & Neustadt, L.L.P.

(57) ABSTRACT

A spin treatment apparatus according to an embodiment performs a treatment while rotating a substrate and includes: at least three clamp pins configured to contact an outer peripheral surface of the substrate and clamp the substrate; rotatable pin rotators provided for the respective clamp pins and each configured to retain the corresponding clamp pin at a position offset from a rotation axis of the pin rotator parallel with a rotation axis of the substrate; magnet gears provided for the respective pin rotators around outer peripheral surfaces thereof and each having a magnetic-pole part formed spirally about the rotation axis of the pin rotator; rotation magnets provided for the respective magnet gears and positioned to attract and be attracted by the magnetic-pole part of the corresponding magnet gear; and a movement mechanism configured to move the rotation magnets along the rotation axes of the pin rotators.

9 Claims, 8 Drawing Sheets

SPIN TREATMENT APPARATUS

CROSS-REFERENCE TO THE RELATED APPLICATION

This application is based on and claims the benefit of priority from Japanese Patent Applications No. 2013-198094, filed on Sep. 25, 2013 and No. 2014-162096, filed on Aug. 8, 2014; the entire contents of which are incorporated herein by reference.

FIELD

Embodiments discussed herein relate to a spin treatment apparatus.

BACKGROUND

A manufacturing process for a semiconductor device or a liquid crystal display device typically includes a film-forming process or a photolithography process to form a circuit pattern on a substrate such as a wafer or a glass plate. A wet process which is performed during the above processes and uses mainly liquid employs a spin treatment apparatus to subject the substrate to treatments such as a chemical treatment, a washing treatment, and a drying treatment. A spin treatment apparatus is an apparatus configured to perform a wet process by clamping the outer peripheral surface of a substrate, rotating the substrate about an axis perpendicular to the substrate at the center thereof, and supplying a treatment liquid (e.g., a chemical liquid or pure water) to the rotating substrate. Such a spin treatment apparatus generally includes a chuck mechanism configured to chuck the substrate.

As this chuck mechanism, multiple clamp pins are provided along the periphery of a substrate to clamp an outer peripheral portion of the substrate. The clamp pins are each integral with a rotary plate and a rotary shaft body, and provided on the rotary plate at a position offset by a certain distance from the rotation axis of the rotary shaft body. Pinions are fixed to the lower ends of the respective rotary shaft bodies, and mesh with a master gear whose rotation axis is perpendicular to the substrate at the center thereof. Hence, when the master gear rotates, the individual rotation shaft bodies rotate, causing the clamp pins to eccentrically rotate. The substrate can be clamped by these clamp pins.

Besides such a gear-type chuck mechanism, a magnet-type chuck mechanism has also been developed. In this magnet-type chuck mechanism, a circular plate is provided at the lower end of each rotary shaft body in place of the pinion described above, and the circular plate has a magnet perpendicular to the rotary shaft body. Bringing another magnet close to this circular plate causes the magnet on the circular plate to rotate with the circular plate due to the attractive force of the other magnet. The rotation of the magnet rotates the rotary shaft body, rotating the clamp pin eccentrically. This magnet-type chuck mechanism is capable of clamping the substrate with the clamp pins like the gear-type chuck mechanism. To unclamp the substrate, a magnet different from the other magnet described above is brought close to an unclamp position which is opposite from a clamp position described above.

However, these chuck mechanisms have their drawbacks. Specifically, the gear-type chuck mechanism reliably performs chuck operation with the clamp pins, but might generate dust due to wear of the gears. The magnet-type chuck mechanism generates no dust, but has the following problem. Specifically, due to the configuration in which the attractive force of another magnet causes the magnet on the circular plate to rotate with the circular plate, the distance between the magnetic poles attracting each other varies during the rotation of the magnet. Since the attractive force between the magnetic poles is inversely proportional to the square of the distance between the magnetic poles, decrease in the distance between the magnetic poles drastically increases the attractive force therebetween. For this reason, when the distance between the magnetic poles fluctuates, the clamp pins tend not to rotate uniformly. The positioning of the substrate is performed based on a single one of the clamp pins which has the smallest distance between the magnetic poles, and such non-uniformity in the pin rotation might cause displacement of the substrate from a predetermined position when clamped. It is therefore demanded to suppress both the generation of dust and the displacement of a substrate when clamped.

DETAILED DESCRIPTION

According to one embodiment, a spin treatment apparatus that performs a treatment while rotating a substrate, the apparatus includes: at least three clamp pins configured to come into contact with an outer peripheral surface of the substrate and clamp the substrate; a plurality of rotatable pin rotators provided for the respective clamp pins and each configured to retain the corresponding clamp pin at a position offset from a rotation axis of the pin rotator which is parallel with a rotation axis of the substrate; a plurality of magnet gears provided for the respective pin rotators around outer peripheral surfaces thereof and each having a magnetic-pole part formed spirally about the rotation axis of the pin rotator; a plurality of rotation magnets provided for the respective magnet gears and positioned so as to attract and be attracted by the magnetic-pole part of the corresponding magnet gear; and a movement mechanism configured to move the plurality of rotation magnets in the direction of the rotation axes of the pin rotators.

Various Embodiments will be described hereinafter with reference to the accompanying drawings.

First Embodiment

A first embodiment is described with reference to FIGS. 1 to 8.

Figure 1:
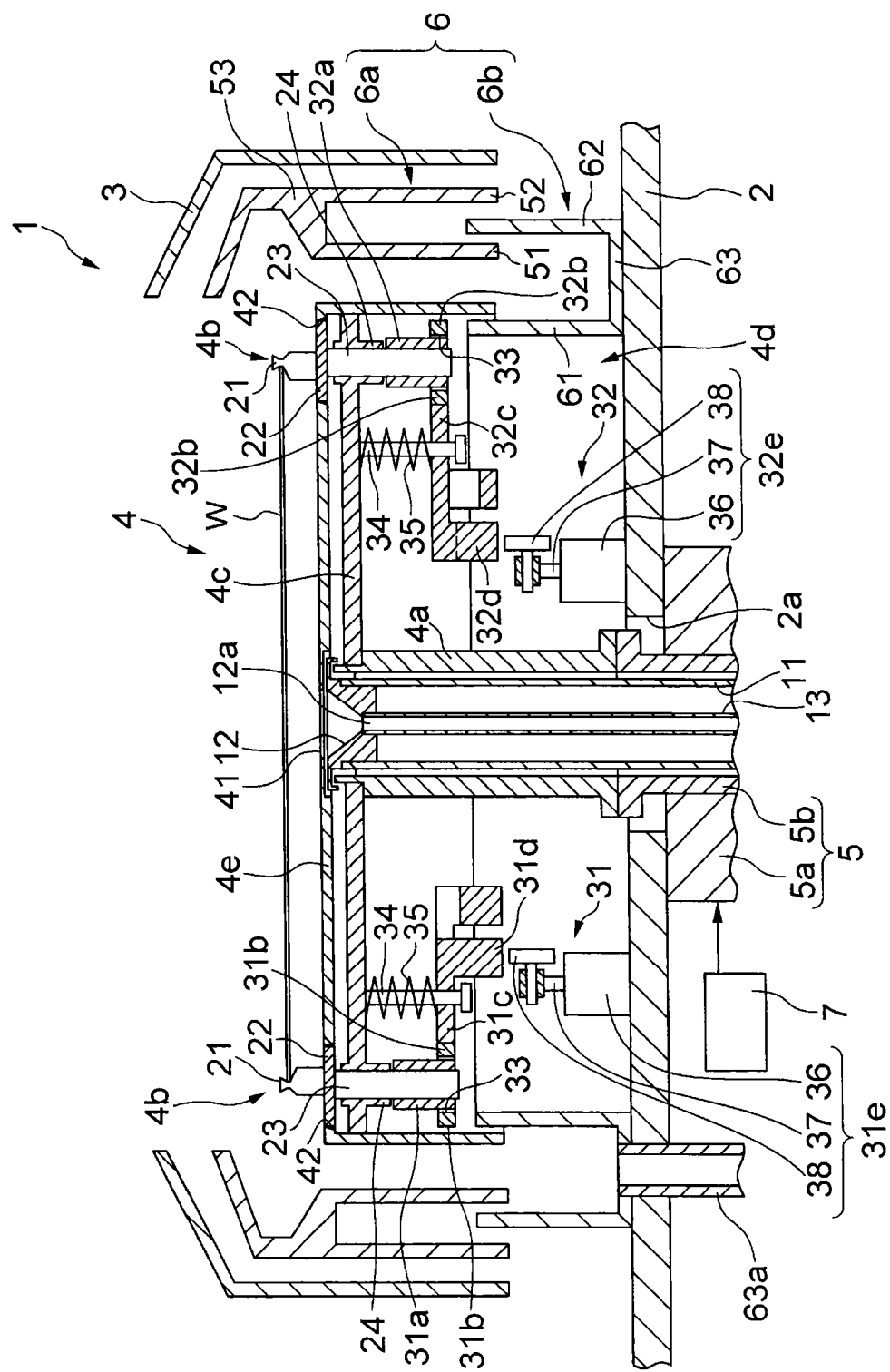
FIG. 1 is a sectional view showing the schematic configuration of a spin treatment apparatus according to a first embodiment.

As shown in FIG. 1, a spin treatment apparatus 1 according to the first embodiment includes: a base body 2 serving as the base of the spin treatment apparatus 1; a cup body 3 with an open upper surface; a rotary body 4 configured to rotate inside the cup body 3; a drive motor 5 configured to rotate the rotary body 4; an annular liquid receiver 6 surrounding the rotary body 4; and a controller 7 (e.g., a microcomputer) configured to control each part.

The base body 2 has a plate shape, and a through-hole 2a is formed at a center portion of a bottom surface of the base body 2. In addition, drainage tubes (not shown) configured to drain sump solution are connected to a peripheral edge portion of the base body 2 at predetermined intervals.

The cup body 3 has a tubular (annular) shape with an open upper surface and an open lower surface, and accommodates thereinside the rotary body 4, the liquid receiver 6, and the like. An upper end portion of the cup body 3 slants radially inward over the entire circumference. The cup body 3 can be moved up and down by an up-and-down mechanism (not shown) such as a cylinder.

The rotary body 4 includes: a cylindrical power transmission body 4a configured to transmit power from the drive motor 5; multiple (e.g., six) clamp portions 4b configured to clamp a substrate W; a rotary plate 4c configured to retain the clamp portions 4b; a rotation mechanism 4d for causing the clamp portions 4b to clamp the substrate W; and a cover 4e configured to cover these parts.

The drive motor 5 includes a tubular stator 5a and a tubular rotor 5b rotatably inserted in the stator 5a. The drive motor 5 is a motor serving as a drive source for rotating the substrate W clamped by the clamp portions 4b. The drive motor 5 is electrically connected to the controller 7, and is driven as controlled by the controller 7.

The power transmission body 4a is fixed to the rotor 5b of the drive motor 5 such that the rotation axis (center axis) of the power transmission body 4a coincides with the rotation axis of the drive motor 5. The power transmission body 4a rotates along with the rotor 5b. In other words, the power transmission body 4a is rotated by the drive motor 5.

A stationary shaft 11 which does not rotate is provided in a space inside the power transmission body 4a and the rotor 5b. This stationary shaft 11 is provided with a nozzle head 12 at an upper portion thereof. A nozzle 12a is formed at the nozzle head 12. The nozzle 12a is configured to eject a treatment liquid (e.g., a chemical liquid or pure water) toward the back surface of the substrate W clamped by the clamp portions 4b, and is connected to a supply pipe 13 through which the treatment liquid flows. In addition, although not shown, a nozzle for supplying a treatment liquid (e.g., a chemical liquid or pure water) to the front surface of the substrate W is also provided above the rotary body 4.

Figure 2:
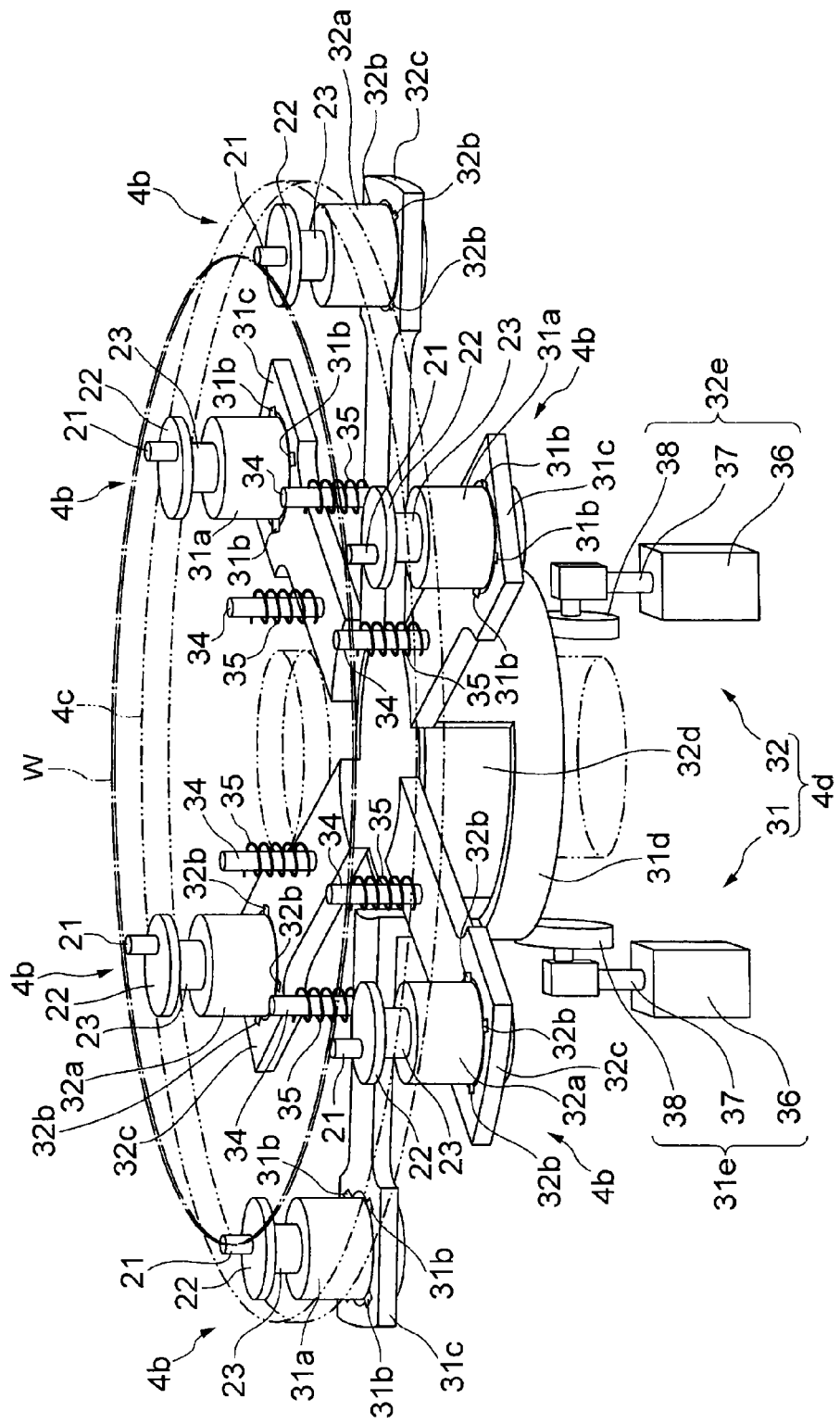
FIG. 2 is a perspective view showing the schematic configuration of a chuck mechanism according to the first embodiment.

As shown in FIGS. 1 and 2, the clamp portions 4b are placed at predetermined intervals, e.g. at regular intervals, circumferentially about the rotation axis of the power transmission body 4a. When put into operation, these clamp portions 4b implement a chuck mechanism for clamping the substrate W with the center of the substrate W being aligned with the rotation axis of the power transmission body 4a.

Each clamp portion 4b includes a clamp pin 21 configured to come into contact with the substrate W, a rotary plate 22 configured to retain the clamp pin 21 and rotate, and a pin rotator 23 configured to retain the rotary plate 22 and rotate. The clamp pin 21 is inversely tapered and is integral with the rotary plate 22 by being fixed to an upper surface of the rotary plate 22 with its center being offset from the rotation axis of the pin rotator 23 by a certain distance. The clamp pin 21 eccentrically rotates as the pin rotator 23 rotates. The pin rotator 23 is rotatably retained by a tubular support portion 24 of the rotary plate 4c.

The clamp portion 4b operates as follows. When the pin rotator 23 rotates in a direction for clamping the substrate W, the clamp pin 21 on the rotary plate 22 eccentrically rotates, coming into contact with the outer peripheral surface (end surface) of the substrate W. Likewise, the clamp pins 21 of the other clamp portions 4b come into contact with the outer peripheral surface of the substrate W. Thus, the clamp pins 21 clamp the substrate W while aligning the center of the substrate W with the rotation axis of the power transmission body 4a. On the other hand, when the pin rotator 23 rotates in an unclamping direction which is the opposite from the clamping direction, the clamp pin 21 on the rotary plate 22 rotates in a direction opposite to the aforementioned direction and moves away from the outer peripheral surface of the substrate W. The clamp pins 21 of the other clamp portions 4b also move away from the outer peripheral surface of the substrate W, unclamping the clamped substrate W.

The rotary plate 4c is integral with the power transmission body 4a by being fixed to the outer peripheral surface of the power transmission body 4a. The rotary plate 4c rotates along with the power transmission body 4a while retaining the clamp portions 4b. When the rotary plate 4c rotates along with the power transmission body 4a as the power transmission body 4a rotates, the clamp portions 4b also rotate about the rotation axis of the power transmission body 4a. The tubular support portions of the rotary plate 4c are provided at an outer peripheral portion of the circular rotary plate 4c at regular intervals along the circumference thereof about the rotation axis of the power transmission body 4a.

The rotation mechanism 4d includes a first rotation mechanism 31 corresponding to a set of three clamp portions 4b which are alternate ones of the clamp portions 4b arranged in the rotation direction of the power transmission body 4a and a second rotation mechanism 32 corresponding to the other set of three clamp portions 4b. In a case where there are six clamp portions 4b, the first rotation mechanism 31 and the second rotation mechanism 32 have the same structure.

The first rotation mechanism 31 includes: magnet gears 31a each provided around an outer peripheral surface of the pin rotator 23 of a corresponding one of the clamp portions 4b; multiple rotation magnets 31b corresponding to each of the magnet gears 31a; a set of up-and-down arms 31c (three up-and-down arms 31c in this embodiment) each retaining the rotation magnets 31b and configured to move up and down; an up-and-down ring 31d integral with the up-and-down arms 31c; and an up-and-down mechanism 31e configured to move the up-and-down ring 31d in a direction of the rotation axes of the pin rotators 23.

Figure 3:
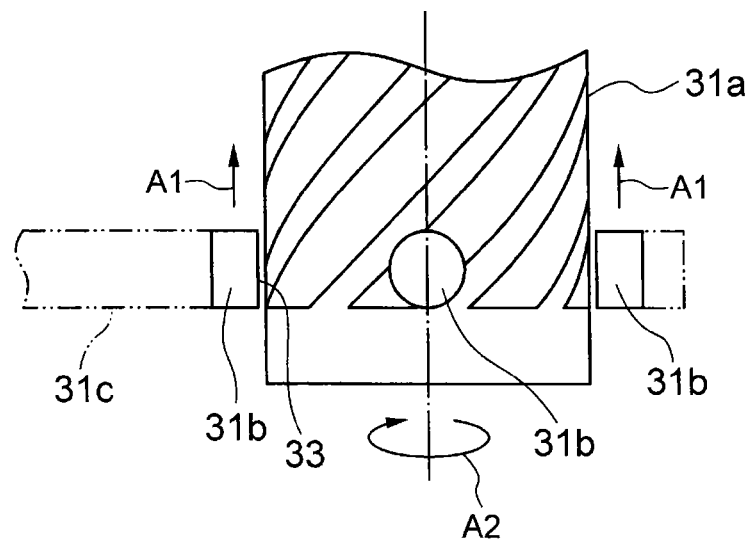
FIG. 3 is a diagram illustrating the positional relation between a magnet gear and rotation magnets according to the first embodiment.
Figure 4:
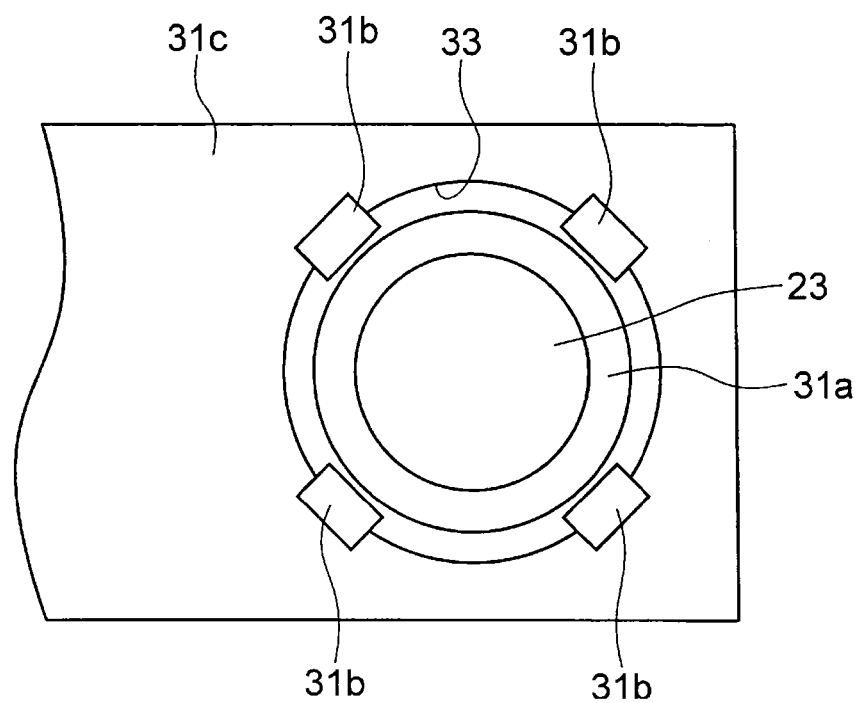
FIG. 4 is a plan view showing the positional relation between the magnet gear and the rotation magnets according to the first embodiment.

As shown in FIGS. 3 and 4, each magnet gears 31a is a cylindrical magnet gear having north magnetic-pole parts (e.g., bands) and south magnetic-pole parts (e.g., bands) alternately arranged in a spiral manner over the cylindrical surface of the pin rotator 23. The magnet gear 31a is, as shown in FIGS. 1 and 2, fixed to a lower portion of the outer peripheral surface of the pin rotator 23, and rotates together with the pin rotator 23. The magnet gear 31a is attached to the pin rotator 23 such that there is no backlash or play in a direction of the rotation axis of the pin rotator 23 (a vertical direction).

As shown in FIGS. 3 and 4, the multiple (e.g., four) rotation magnets 31b are arranged along the outer peripheral surface of the magnet gear 31a at positions at which they attract the magnetic-pole parts on the surface of the magnet gear 31a. The rotation magnets 31b are fixed to the up-and-down arm 31c. The rotation magnets 31b are arranged in an edge portion of a through-hole 33 formed in the up-and-down arm 31c, at regular intervals or at regular intervals with some angle added. In this through-hole 33, the magnet gear 31a and the pin rotator 23 are inserted. Such rotation magnets 31b are provided for each up-and-down arm 31c.

When the rotation magnets 31b move up in a direction of arrow A1 shown in FIG. 3, the magnet gear 31a rotates in a direction of arrow A2 shown in FIG. 3. Since the rotation magnets 31b and the magnetic-pole parts of the magnet gear 31a attract each other, the rotation magnets 31b move up while attracting the magnetic-pole parts of the magnet gear 31a. In addition, because of the spiral arrangement of the magnetic-pole parts of the magnet gear 31a, when the rotation magnets 31b move up in the direction of arrow A1, the magnet gear 31a rotate in the direction of arrow A2 to maintain the state in which the rotation magnets 31b and the magnetic-pole parts of the magnet gear 31a attract each other. During the rotation of the magnet gear 31a caused by the elevation of the rotation magnets 31b, there is no change in the distance between the magnetic poles, i.e., the distance between the magnet gear 31a and the rotation magnets 31b. Hence, the attractive force is maintained constant. When the rotation magnets 31b move down in a direction opposite from arrow A1, the magnet gear 31a rotates in a direction opposite from arrow A2.

Referring back to FIGS. 1 and 2, the set of up-and-down arms 31c are connected at their base portions to the up-and-down ring 31d which is a ring-shaped member. These up-and-down arms 31c are supported by respective up-and-down shafts 34 fixed to the rotary plate 4c, and are slidable relative to the up-and-down shafts 34. The up-and-down shafts 34 are attached to the rotary plate 4c in such a manner as to be parallel with the rotation axis of the power transmission body 4a. The up-and-down shafts 34 allow the up-and-down arms 31c to move up and down with their postures being maintained to be perpendicular to the rotation axis of the power transmission body 4a. A clamp spring 35 is provided to each of the up-and-down shafts 34. The clamp spring 35 is located between the rotary plate 4c and the corresponding up-and-down arm 31c and presses the up-and-down arm 31c down with a certain spring force.

The up-and-down ring 31d is a ring-shaped member that unites and supports the set of up-and-down arms 31c. The up-and-down ring 31d has the power transmission body 4a inserted therethrough and is movable in the direction of the rotation axis of the power transmission body 4a (the vertical direction) along the outer peripheral surface of the power transmission body 4a. The up-and-down ring 31d unites the three up-and-down arms 31c, and at the same time, enables them to move (up and down).

The up-and-down mechanism 31e has a cylinder 36 such as an air cylinder, a cylinder shaft 37 configured to be moved up and down by the cylinder 36, and an up-and-down roller 38 attached to a tip portion of the cylinder shaft 37. The cylinder 36 is fixed to the base body 2. The up-and-down roller 38 is provided at an end portion of the cylinder shaft 37 so that the up-and-down roller 38 comes into contact with the lower surface of the up-and-ring 31d when moving up. The up-and-down ring 31d moves up in the direction of the rotation axis of the power transmission body 4a when the up-and-down roller 38 moves up and contacts the lower surface of the up-and-down ring 31d to push the up-and-down ring 31d up in the direction of the rotation axis of the power transmission body 4a.

When the up-and-down mechanism 31e elevates the up-and-down ring 31d in the direction of the rotation axis of the power transmission body 4a, the set of (three) up-and-down arms 31c moves up in the direction of the rotation axis of the power transmission body 4a. Thus, the rotation magnets 31b fixed to each of the up-and-down arms 31c move up while maintaining the state of attracting the magnetic-pole parts of the magnet gear 31a, as described earlier. When the rotation magnets 31b move up, the magnet gear 31a rotates to maintain the state of attracting the rotation magnets 31b. In this event, the distance between the magnetic poles, i.e., the distance between the magnet gear 31a and the rotation magnets 31b does not change. Hence, the magnet gear 31a can rotate while maintaining a constant attractive force, allowing the corresponding clamp pin 21 to rotate at a constant velocity.

The attractive force between the magnet gear 31a and the rotation magnets 31b is adjusted by changing, for example, the number and arrangement of the magnets so that, when the up-and-down arm 31c is lowered by being pushed down by the force of the compressed clamp spring 35 and thereby lowers the rotation magnets 31b, the magnet gear 31a may rotate while constantly maintaining the state (relation) in which the magnet gear 31a and the rotation magnets 31b moving down attract and face each other. Thereby, while the magnet gear 31a rotates when the rotation magnets 31b move down, the magnet gear 31a and the rotation magnets 31b constantly maintain the state of attracting and facing each other. For this reason, the up-and-down arm 31c moves down due to the spring force of the clamp spring 35, and the rotation magnets 31b accordingly move down. In this event, the clamp spring 35 gradually extends as the up-and-down arm 31c moves down, pushing the up-and-down arm 31c down with less force. The up-and-down arm 31c is designed to eventually stop moving down once this force of the clamp spring 35 pushing the up-and-down arm 31c becomes smaller than the attractive force acting between the magnet gear 31a and the rotation magnets 31b (the attractive force constantly maintaining the state in which the magnet gear 31a and the rotation magnets 31b attract and face each other). In this way, the spring force (pushing force) of the clamp springs 35 pushing the up-and-down arms 31c down can be used as clamping force with which the clamp pins 21 clamp the substrate W.

Moreover, the set of up-and-down arms 31c on which the force of the clamp springs 35 are acting can move up when the up-and-down ring 31d is elevated by the up-and-down mechanism 31e. Then, the rotation magnets 31b fixed to the set of up-and-down arms 31c move up to rotate the magnet gears 31a, which consequently rotates the clamp pins 21 which is clamping the substrate W by use of the force of the clamp springs 35. The rotation of the clamp pins 21 unclamps the substrate W. Note that the force of the clamp springs 35 pushing down the up-and-down arms 31c acts as the clamping force. Herein, to unclamp the substrate W, the up-and-down mechanism 31e elevates the up-and-down ring 31d, compressing the clamp springs 35 and elevating the set of up-and-down arms 31c to thereby rotate the three clamp pins 21.

Conversely, when the up-and-down mechanism 31e lowers the up-and-down ring 31d, the set of up-and-down arms 31c moves down, and consequently the magnet gears 31a rotate reversely, bringing the clamp pins 21 into contact with the end portion of the substrate W. When the clamp pins 21 clamp the substrate W, the set of up-and-down arms 31c stops moving down, and the clamp pins 21 stop while applying force to the substrate W with the pressure of the clamp springs 35. At the same time that the up-and-down mechanism 31e lowers the up-and-down ring 31d, the clamp springs 35 extend to generate force of pushing the set of up-and-down arms 31c down. The magnet gears 31a are rotated by this force, and the three clamp pins 21 eccentrically rotate to come into compact with the substrate W and clamp the substrate W. When the clamp pins 21 come into contact with the substrate W, the clamp springs 35 do not extend all the way, but stop halfway.

Since the cylinder 36 is configured to elevate or lower the cylinder shaft 37 by a constant amount irrespective of whether the set of the up-and-down arms 31c moves down and stops. Hence, the cylinder shaft 37 stops with a gap existing between the up-and-down ring 31d and the up-and-down roller 38. In other words, when the cylinder shaft 37 is at the lowermost position, the up-and-down roller 38 is not in contact with the up-and-down ring 31d, but is separated from the lower surface of the up-and-down ring 31d. Thereby, during the rotation of the rotary body 4, the up-and-down ring 31d can rotate smoothly without touching the up-and-down roller 38. In addition, it is also possible to elevate the up-and-down ring 31d during the rotation of the rotary body 4 by bringing the up-and-down roller 38 into contact with the lower surface of the up-and-down ring 31d. Thus, the clamp pins 21 can be put into or out of operation irrespective of whether the rotary body 4 is rotating or is stopped.

The second rotation mechanism 32 includes: magnet gears 32a each provided on an outer peripheral surface of the pin rotator 23 of a corresponding one of the clamp portions 4b; multiple rotation magnets 32b corresponding to each of the magnet gears 32a; a set of up-and-down arms 32c (three up-and-down arms 32c in this embodiment) each retaining the rotation magnets 32b and configured to move up and down; an up-and-down ring 32d integral with the up-and-down arms 32c; and an up-and-down mechanism 32e configured to move the up-and-down ring 32d in the direction of the rotation axes of the pin rotators 23. Since the second rotation mechanism 32 has the same configuration as the first rotation mechanism 31, a description of the portions of the second rotation mechanism 32 is omitted.

Note that the set of up-and-down arms 31c and the up-and-down ring 31d of the first rotation mechanism 31 function as a retainer, and this retainer and the up-and-down mechanism 31e function as a movement mechanism for moving the rotation magnets 31b in the direction of the rotation axis of the corresponding pin rotator 23. Similarly, the set of up-and-down arms 32c and the up-and-down ring 32d of the second rotation mechanism 32 function as a retainer, and this retainer and the up-and-down mechanism 32e function as a movement mechanism for moving the rotation magnets 32b in the direction of the rotation axis of the corresponding pin rotator 23.

The number of the spiral magnetic-pole parts (e.g., bands) and the number of the rotation magnets 31b in the first rotation mechanism 31 or the second rotation mechanism 32 are not limited and each may be one as long as the pin rotators 23 can be rotated by the magnet gears 31a or 32a. It is however desirable to have two or more combinations of the spiral magnetic-pole part and the rotation magnet 31b to improve the stability of the rotation of the pin rotator 23.

The cover 4e is a case with an open lower surface, and covers the aforementioned parts configured to rotate with the rotation of the power transmission body 4a in order to prevent occurrence of turbulent flow. The cover 4e has an opening portion 41 configured to allow the treatment liquid ejected from the nozzle 12a of the nozzle head 12 to pass up therethrough, and multiple through-holes 42 in which the rotary plates 22 of the clamp portions 4b are inserted.

The liquid receiver 6 includes an annular movable liquid receiver (first liquid receiver) 6a and an annular stationary liquid receiver (second liquid receiver) 6b. The movable liquid receiver 6a and the stationary liquid receiver 6b are provided to surround the rotary body 4 with their centers coinciding with the rotation axis of the rotary body 4, i.e., the rotation axis of the power transmission body 4a.

The movable liquid receiver 6a has an annular inner wall 51, an annular outer wall 52, and an annular upper-surface wall 53 connecting the upper end portions of the inner wall 51 and the outer wall 52 together. The upper end portion of the inner wall 51 slants radially inward over the entire circumference. The annular inner wall 51 and outer wall 52 have an annular space of a predetermined width in between.

An up-and-down mechanism (not shown) such as a cylinder enables the movable liquid receiver 6a to move up and down, or specifically, between a liquid receiving position (see FIG. 1) at which its surface on the rotary body 4 side (inner surface) receives liquid from the substrate W and a lid-closing position at which the movable liquid receiver 6a prevents ingress of liquid to the stationary liquid receiver 6b. The upper end portion of the movable liquid receiver 6a is higher than the height of the substrate W on the rotary body 4 at the liquid receiving position and is lower than the height of the substrate W on the rotary body 4 at the lid-closing position. Hence, to collect a treatment liquid, the movable liquid receiver 6a moves up to the liquid-receiving position to receive the liquid from the substrate W on the rotary body 4 and passes the liquid into the stationary liquid receiver 6b.

The stationary liquid receiver 6b has an annular inner wall 61, an annular outer wall 62, and a bottom-surface wall 63 connecting the lower end portions of the inner wall 61 and the outer wall 62 together. Multiple collection pipes 63a for collecting a chemical liquid are connected to the bottom-surface wall 63 along the circumference thereof at predetermined intervals. The annular inner wall 61 and outer wall 62 have an annular space of a predetermined width in between.

The stationary liquid receiver 6b is placed such that the inner wall 51 of the movable liquid receiver 6a and the outer peripheral wall of the cover 4e are located between the annular inner wall 61 and the annular outer wall 62. The stationary liquid receiver 6b can collect the liquid received by the inner surface of the movable liquid receiver 6a. More specifically, the stationary liquid receiver 6b can collect the liquid which has hit the inner surface of the movable liquid receiver 6a, in the space between the two annular walls: the inner wall 61 and the outer wall 62.

The stationary liquid receiver 6b has a structure in which the movable liquid receiver 6a which is down at the lid-closing position serves as a lid closing the opening of the stationary liquid receiver 6b. When down at the lid-closing position to serve as the lid closing the opening of the stationary liquid receiver 6b, the movable liquid receiver 6a prevents liquid from flowing into the stationary liquid receiver 6b. Since the annular outer wall 62 is covered by the outer wall 52 of the movable liquid receiver 6a to ensure the prevention of liquid ingress to the stationary liquid receiver 6b, mixing of liquids can be prevented.

Next, spin treatment operation of the spin treatment apparatus 1 configured as above is described.

Figure 5:
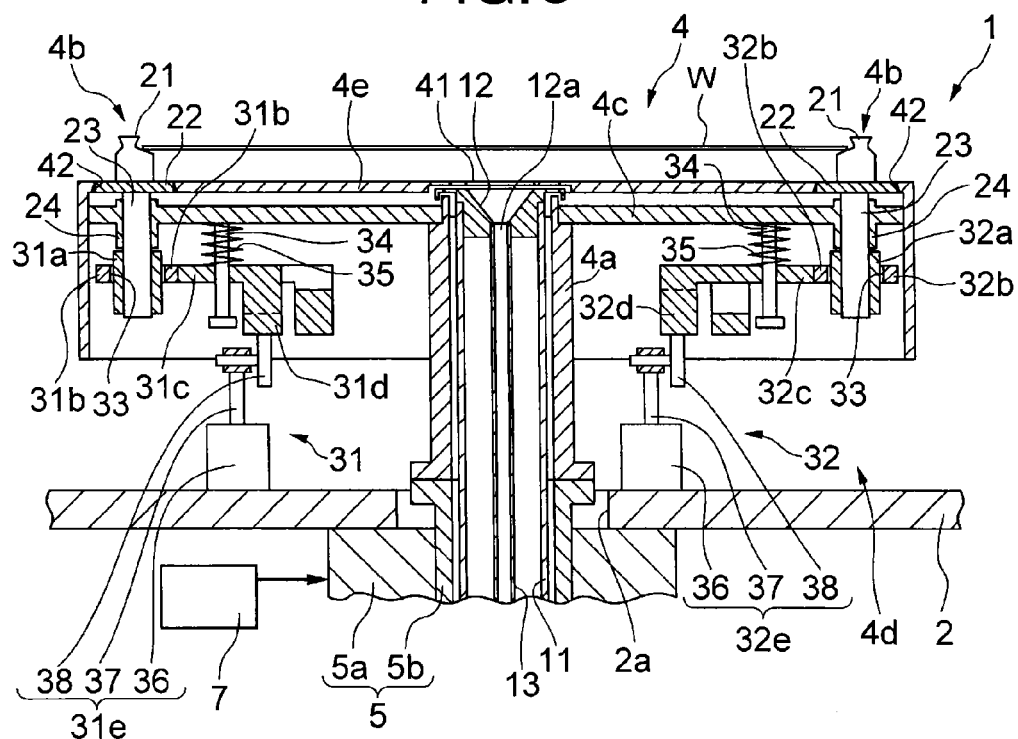
FIG. 5 is a sectional view showing a state where all clamp pins of the spin treatment apparatus according to the first embodiment are out of substrate-clamping operation.
Figure 6:
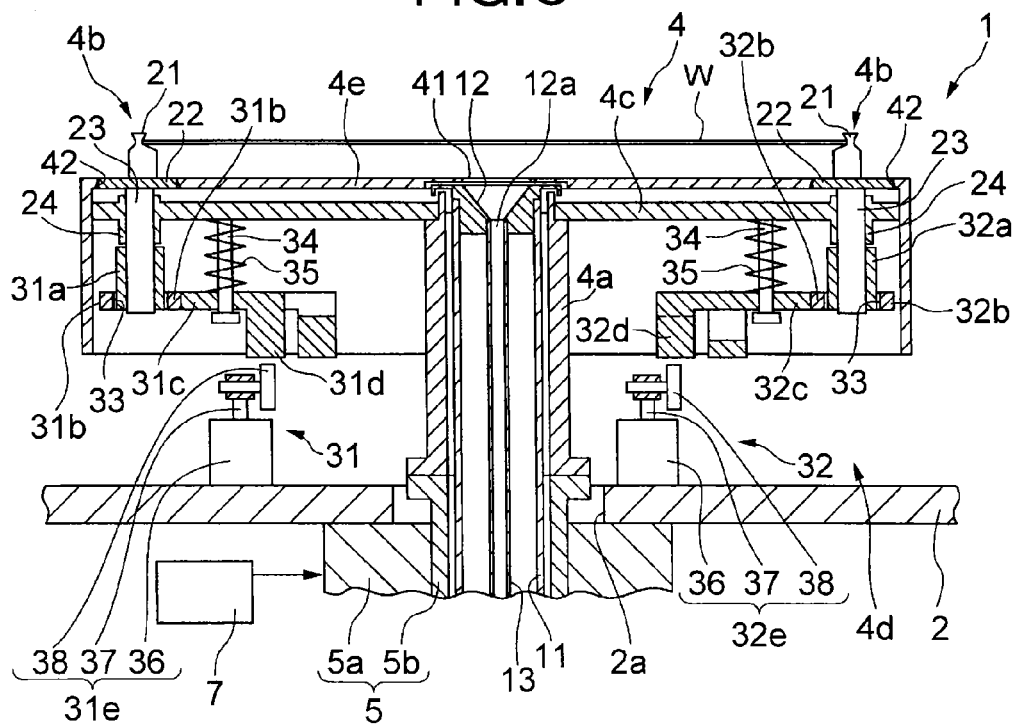
FIG. 6 is a sectional view showing a state where the entire clamp pins of the spin treatment apparatus according to the first embodiment are in substrate-clamping operation.
Figure 7:
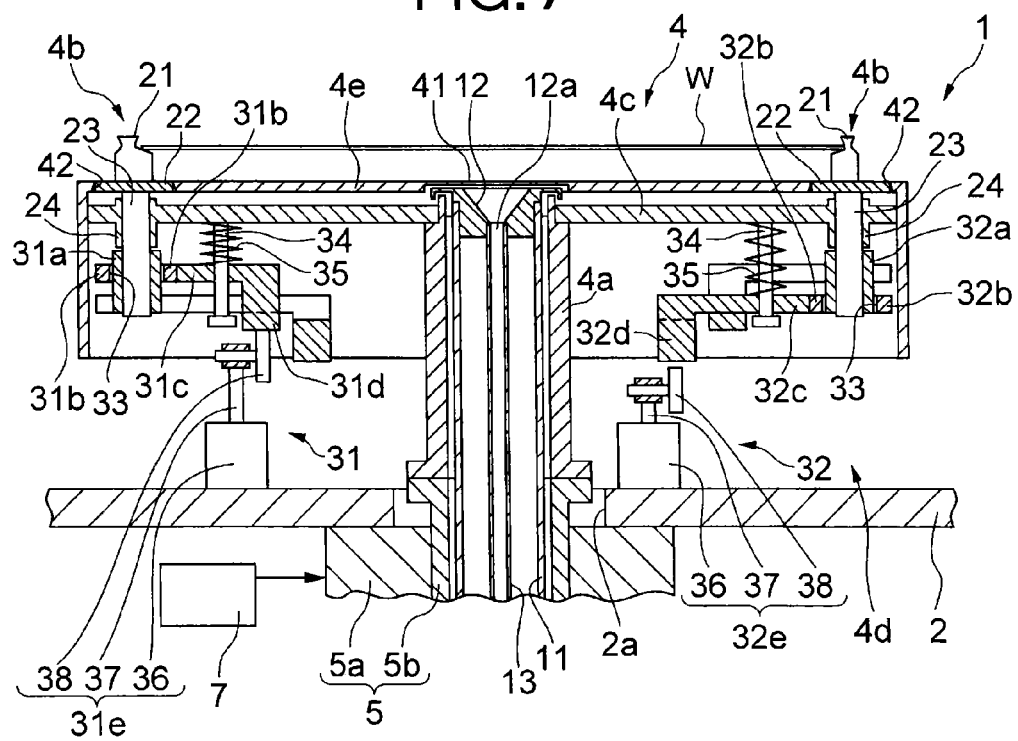
FIG. 7 is a sectional view showing a state where one set of clamp pins of the spin treatment apparatus according to the first embodiment is in substrate-clamping operation.
Figure 8:
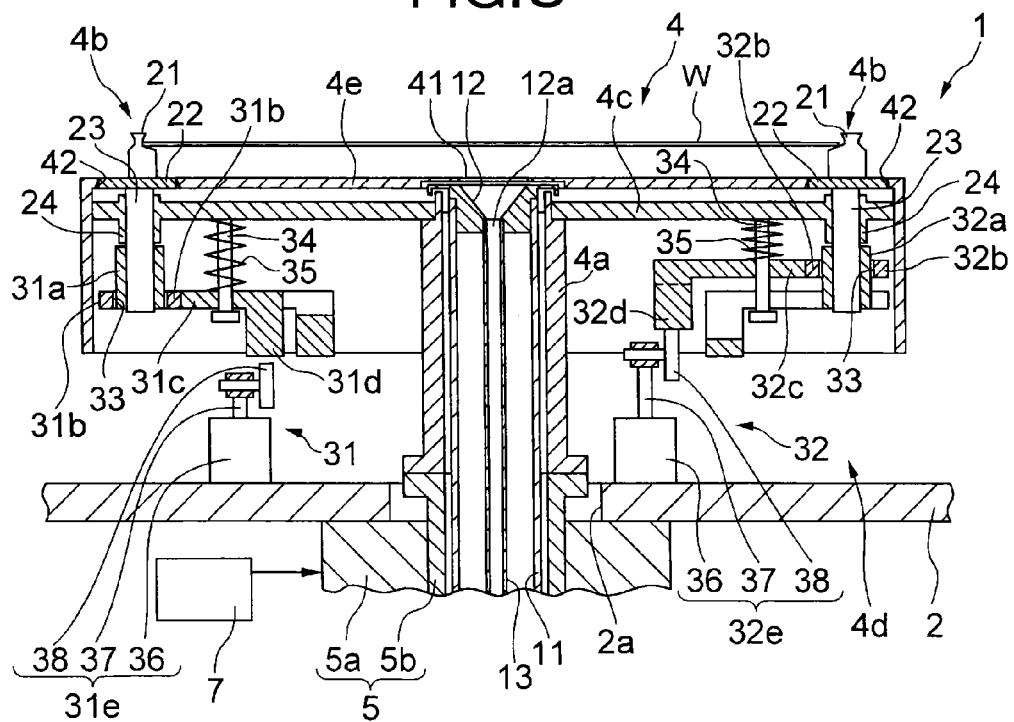
FIG. 8 is a sectional view showing a state where the other set of clamp pins of the spin treatment apparatus according to the first embodiment is in substrate-clamping operation.

The spin treatment operation has the following steps: placing the substrate W onto the clamp pins 21 as shown in FIG. 5, clamping the substrate W with all the clamp pins 21 before treatment as shown in FIG. 6, putting a set of clamp pins 21 out of clamping operation during the treatment as shown in FIG. 7, putting another set of clamp pins 21 out of clamping operation during the treatment as shown in FIG. 8, and putting all the clamp pins 21 out of clamping operation after the treatment as shown in FIG. 5.

As shown in FIG. 5, in the step of placing the substrate W on the clamp pins 21, all the clamp pins 21 of the clamp portions 4b are out of operation of clamping the substrate W. Then, a conveyance mechanism (not shown) such as a robot with a robot hand places the substrate W onto slanted surfaces of the clamp pins 21. In this state, the up-and-down ring 31d and the up-and-down ring 32d are up by elevation of the up-and-down rollers 38 of the up-and-down mechanism 31e and the up-and-down mechanism 32e, respectively, so that the two sets of up-and-down arms 31c and 32c are up in the direction of the rotation axis. Thus, the rotation magnets 31b and 32b fixed to the two sets of up-and-down arms 31c and 32c have also been moved up to cause the magnet gears 31a and 32a to rotate a certain amount. The clamp pins 21 have rotated along with rotation of the pin rotators 23 and the rotary plates 22, and are stopped at positions for unclamping the substrate W.

Next, as shown in FIG. 6, in the step of clamping the substrate W with all the clamp pins 21 before treatment, the up-and-down roller 38 of the up-and-down mechanism 31e and the up-and-down roller 38 of the up-and-down mechanism 32e move down to lower the up-and-down ring 31d and the up-and-down ring 32d, respectively, from the aforementioned state in FIG. 5. Thereby, the two sets of up-and-down arms 31c and 32c move down in the direction of the rotation axis. Thereby, the rotation magnets 31b fixed to the two sets of up-and-down arms 31c and 32c also move down, consequently rotating the magnet gears 31a and 32a. Then, all the clamp pins 21 are rotated by the rotation of the pin rotators 23 and the rotary plates 22, and stop after clamping the substrate W with the clamping force of the clamp springs 35. At the same time that the up-and-down mechanisms 31e and 32e lower the up-and-down rings 31d and 32d, the clamp springs 35 extend, exerting a force pushing down the two sets of up-and-down arms 31c and 32c. By using this pushing force to rotate the magnet gears 31a, the six clamp pins 21 eccentrically rotate to come into contact with the substrate W, and clamp the substrate W. When the clamp pins 21 come into contact with the substrate W, the clamp springs 35 do not extend all the way, but stop halfway.

Here, all the clamp pins 21 eccentrically rotate and come into contact with the outer peripheral surface of the substrate W to clamp the substrate W. When the up-and-down rings 31d and 32d move down, the set of up-and-down arms 31c and the set of up-and-down arms 32c integral with the respective up-and-down rings 31d and 32d synchronously move down while keeping their horizontal posture. Thus, the clamp pins 21 (three clamp pins 21 in this embodiment) corresponding to each of the set of up-and-down arms 31c and the set of up-and-down arms 32c also synchronously rotate. Thereby, the substrate W is clamped with all the clamp pins 21 with the center of the substrate W being aligned with the rotation axis (the substrate W is centered with all the clamp pins 21). Note that, for the clamping of the substrate W, the up-and-down mechanisms 31e and 32e may be operated at the same time in synchronization, or may be actuated at different timings.

Next, as shown in FIG. 7, in the step of putting one set of the clamp pins 21 out of clamping operation during the treatment, the up-and-down roller 38 of the up-and-down mechanism 31e moves up to elevate the up-and-down ring 31d from the aforementioned state in FIG. 6, thereby elevating the set of up-and-down arms 31c in the direction of the rotation axis. Thus, the rotation magnets 31b fixed to the set of up-and-down arms 31c also move up to cause the magnet gears 31a to rotate a certain amount. The pin rotators 23 and the rotary plates 22 are thereby rotated to rotate the clamp pins 21, and the clamp pins 21 are stopped at positions for unclamping the substrate W. When the one set of clamp pins 21 is put out of clamping operation in this way, the drive motor 5 rotates the rotary body 4, and a treatment liquid (e.g., a chemical liquid or pure water) is started to be supplied to the upper surface and the lower surface of the rotating substrate W. Note that the one set of clamp pins 21 can be put out of clamping operation at various timings. The one set of clamp pins 21 may be put out of clamping operation before the substrate W is rotated or after the rotation of the substrate W stabilizes.

During the supply of the treatment liquid, the treatment liquid supplied to the upper and lower surfaces of the substrate W flows radially outward of the substrate W and flies from the outer peripheral edge of the substrate W due to the centrifugal force and airflows generated by the rotation. In this event, by moving the movable liquid receiver 6a (up and down), the flow channel of the treatment liquid can be switched between a collection flow channel for collecting the treatment liquid and a drainage flow channel for draining the treatment liquid. When the liquid flow channel is the collection flow channel, i.e., the movable liquid receiver 6a is up at the liquid receiving position to collect the treatment liquid (see FIG. 1), liquid flying from the end portion of the substrate W hits the inner surface of the movable liquid receiver 6a, flows along the inner surface, is collected in the stationary liquid receiver 6b, and is then collected through the collection pipes 63a. On the other hand, when the liquid flow channel is the drain flow channel, i.e., the movable liquid receiver 6a is down at the lid-closing position to drain the treatment liquid, liquid flying from the end portion of the substrate W hits the inner peripheral surface of the cup body 3, flows through a flow channel extending from the cup body 3 to the base body 2, and is then drained through the drainage tubes.

Thereafter, as shown in FIG. 8, in the step of putting the other set of clamp pins 21 out of clamping operation during the treatment, the up-and-down roller 38 of the up-and-down mechanism 31e moves down to lower the up-and-down ring 31d from the aforementioned state in FIG. 7, thereby lowering the set of up-and-down arms 31c in the direction of the rotation axis. Thus, the rotation magnets 31b fixed to the set of up-and-down arms 31c also move down to cause the magnet gears 31a to rotate. The pin rotators 23 and the rotary plates 22 thereby rotate to rotate the clamp pins 21, and the clamp pins 21 are stopped after clamping the substrate W with the clamping force of the clamp springs 35. At the same time that the up-and-down mechanism 31e lowers the upand-down ring 31d, the clamp springs 35 extend, exerting a force pushing down the one set of up-and-down arms 31c. By using this pushing force to rotate the magnet gears 31a, the three clamp pins 21 eccentrically rotate to come into contact with the substrate W, and clamp the substrate W. When the clamp pins 21 come into contact with the substrate W, the clamp springs 35 do not extend all the way, but stop halfway.

Next, the up-and-down roller 38 of the up-and-down mechanism 32e moves up to elevate the up-and-down ring 32d, thereby elevating the set of up-and-down arms 32c in the direction of the rotation axis. The rotation magnets 32b fixed to the set of up-and-down arms 32c thereby move up, causing the magnet gears 32a to rotate a certain amount. The pin rotators 23 and the rotary plates 22 thereby rotate to rotate the clamp pins 21, and the clamp pins 21 are stopped at positions for unclamping the substrate W. Although the other set of clamp pins 21 is thus put out of clamping operation, the rotary body 4 is still being rotated by the drive motor 5 with the treatment liquid continuing being supplied to the upper (front) and lower (back) surfaces of the rotating substrate W.

When a liquid treatment and a rinsing treatment with pure water are all finished, the supply of the treatment liquid is stopped, and as shown in FIG. 6, the substrate W is once again clamped with all the clamp pins 21. To be more specific, the up-and-down roller 38 of the up-and-down mechanism 32e moves down to lower the up-and-down ring 32d from the aforementioned state in FIG. 8, thereby lowering the set of up-and-down arms 32c in the direction of the rotation axis. The rotation magnets 32b fixed to the set of up-and-down arms 32c thereby move down, causing the magnet gears 32a to rotate. The pin rotators 23 and the rotary plates 22 thereby rotate to rotate the clamp pins 21, and the clamp pins 21 are stopped after clamping the substrate W with the clamping force of the clamp springs 35. At the same time that the up-and-down mechanism 32e lowers the up-and-down ring 32d, the clamp springs 35 extend, exerting a force pushing down the set of up-and-down arms 32c. By using this pushing force to rotate the magnet gears 32a, the three clamp pins 21 eccentrically rotate to come into contact with the substrate W, and clamp the substrate W. When the clamp pins 21 come into contact with the substrate W, the clamp springs 35 do not extend all the way, but stop halfway.

Thereafter, the rotary body 4 rotates at a speed higher than that during the liquid supply stage (spin dry). After a predetermined period of dry treatment, the substrate W is stopped rotating while maintaining the aforementioned state shown in FIG. 6. Finally, after the rotation of the substrate W is stopped, all the clamp pins 21 are put out of operation of clamping the substrate W as shown in FIG. 5. In this unclamping step, the up-and-down roller 38 of the up-and-down mechanism 31e and the up-and-down roller 38 of the up-and-down mechanism 32e move up to elevate the up-and-down ring 31d and the up-and-down ring 32d, respectively, so that the two sets of up-and-down arms 31c and 32c move up in the direction of the rotation axis. Thereby, the rotation magnets 31b and 32b fixed to those two sets of up-and-down arms 31c and 32c also move up to cause the magnet gears 31a and 32a to rotate a certain amount. The pin rotators 23 and the rotary plates 22 thereby rotate to rotate the clamp pins 21, and the clamp pins 21 stop at the positions for unclamping the substrate W. In this way, all the clamp pins 21 are put out of clamping operation. After being unclamped, the substrate W on the slanted surfaces of the clamp pins 21 is conveyed by the aforementioned conveyance mechanism.

In such spin treatment steps, when the clamp pins 21 are put in or out of clamping operation, the magnet gears 31a or 32a rotate while maintaining a constant attractive force between the magnetic poles because there is no changed in the distance between the magnetic poles, i.e., the distance between each magnet gear 31a and the rotation magnets 31b and the distance between each magnet gear 32a and the rotation magnets 32b. For this reason, the clamp pins 21 can rotate at a constant velocity. The even rotation of the clamp pins 21 prevents the substrate W from being offset from its predetermined position, enabling precise centering of the substrate W.

By lowering the two sets of up-and-down arms 31c and 32c separately (on a set-by-set basis), the alternately-located three clamp pins 21 are synchronized to be able to clamp the substrate W with the substrate W being centered. The six clamp pins 21 form two sets of three clamp pins 21, each set functioning as a three-claw clamp. Conversely, by elevating one of the two sets of up-and-down arms 31c and 32c, the alternately-located three clamp pins 21 corresponding to that set can be put out of clamping operation. Hence, even when the substrate W is rotating, half of the clamp pins 21 can change from the clamping state to the unclamping state and from the unclamping state to the clamping state alternately. During rotation of the substrate W, the substrate W must be clamped with a constant clamping force. Hence, when the substrate W is clamped with one of the groups of clamp pins 21 and unclamped with the other group of clamp pins 21, the treatment liquid can be spread over to the contact portions between the substrate W and the clamp pins 21 to prevent the substrate W from remaining untreated partially.

The mechanism for putting the clamp pins 21 into and out of operation is achieved independent of the mechanism for rotating the substrate W, and moreover, a mechanism for transforming linear motion into rotation can be achieved in a contactless manner. To be more specific, a simple mechanism is achieved, which is capable of putting the clamp pins 21 into and out of operation from the non-rotating side even during rotation of the substrate W, and of implementing the function of moving the clamp pins 21 away from the substrate reliably when unclamping the substrate W and the function of aligning the center of the substrate W with the center of rotation when clamping the substrate W.

As described above, according to the first embodiment, the clamp pins 21 are rotated by using the magnet gears 31a (or 32a) and the rotation magnets 31b (or 32b), i.e., by magnet-type pin rotation. Thus, generation of dust can be suppressed. Further, during the pin rotation, the distance between the magnetic poles, i.e., the distance between each magnet gear 31a (or 32a) and the rotation magnets 31b (or 32b) is maintained to be constant. Thus, the clamp pins 21 can be rotated evenly, preventing the substrate W from being offset from its predetermined position when clamped.

Second Embodiment

Figure 9:
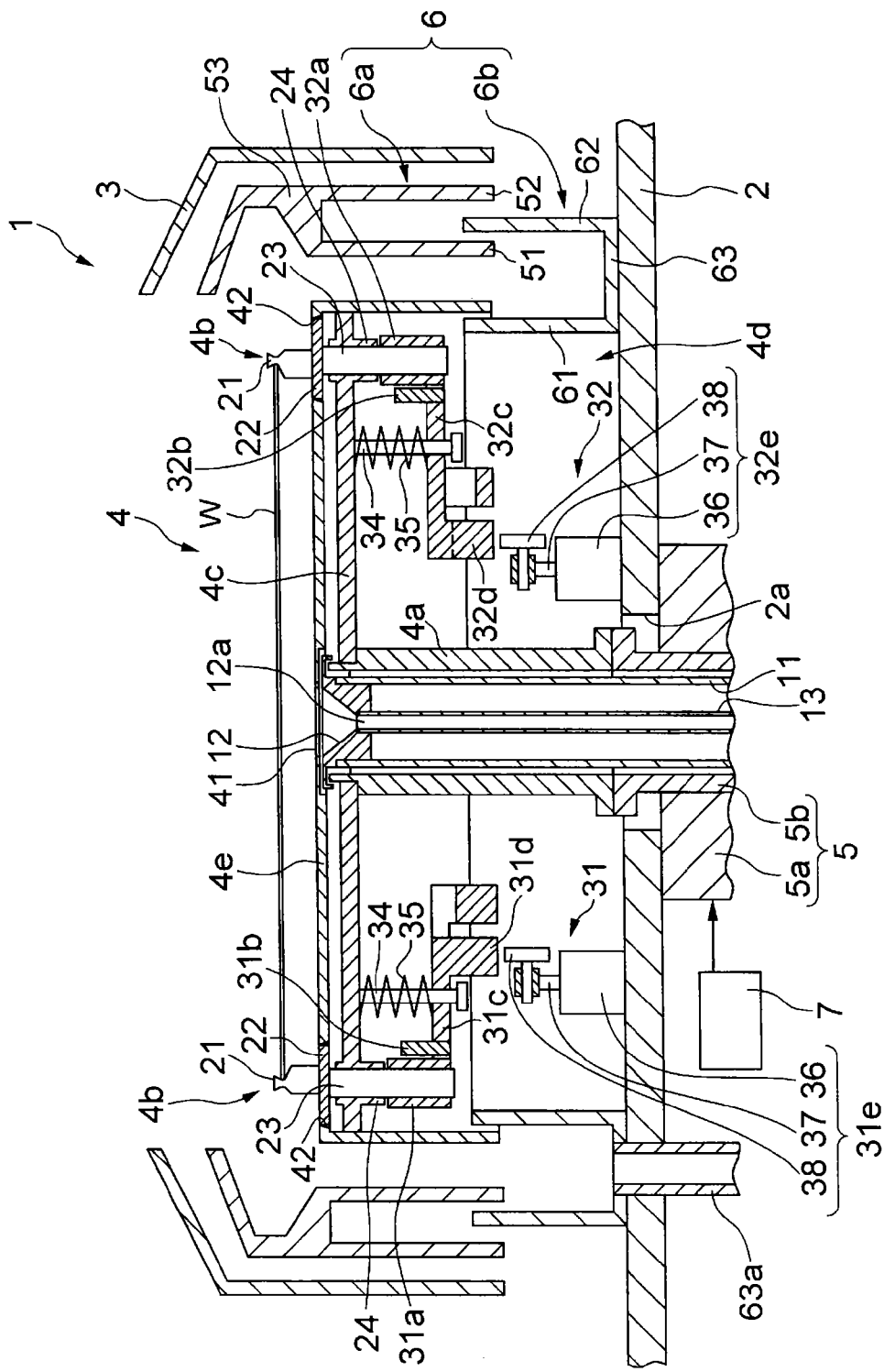
FIG. 9 is a sectional diagram showing the schematic configuration of a spin treatment apparatus according to a second embodiment.
Figure 10:
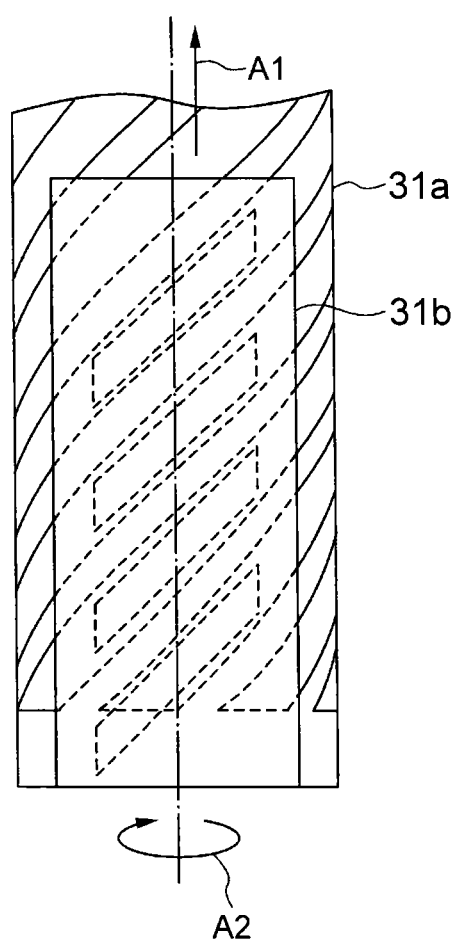
FIG. 10 is a diagram illustrating the positional relation between a magnet gear and a planar magnet according to the second embodiment.

With reference to FIGS. 9 and 10, a second embodiment is described.

The second embodiment is basically the same as the first embodiment. Hence, only the difference between the first embodiment and the second embodiment (the structure of the rotation magnets 31b and 32b) is described. Portions in the second embodiment that are the same as those in the first embodiment are denoted by the same reference numerals as those used in the first embodiment, and are not described again here.

As shown in FIG. 9, a spin treatment apparatus 1 according to the second embodiment has a rotation magnet 31b provided to a tip end portion of each of the up-and-down arms 31c, and a rotation magnet 32b to a tip end portion of each of the up-and-down arms 32c. The rotation magnet 31b and the rotation magnet 32b have the same structure; therefore, the rotation magnet 32b is not described. The up-and-down arms 31c and 32c do not have the through-holes 33 provided in the first embodiment.

As shown in FIG. 10, the rotation magnet 31b is a planar magnet having north magnetic-pole parts (e.g., bands) and south magnetic-pole parts (e.g., bands) arranged alternately vertically. This planar magnet has a plate-shaped structure in which multiple (e.g., four) magnetic-pole parts are arranged on a plane parallel to the spiral magnetic-pole parts (slanted magnetic-pole parts) of the magnet gear 31a, in a slanted manner to match the slanted magnetic-pole parts of the magnet gear 31a.

When the planar magnet moves up in a direction of arrow A1 shown in FIG. 10, the magnet gear 31a rotates in a direction of arrow A2 shown in FIG. 10. Since the planar magnet and the magnetic-pole parts of the magnet gear 31a attract each other, the planar magnet moves up while maintaining the state of attracting and being attracted by the magnetic-pole parts of the magnet gear 31a. The spiral arrangement of the magnetic-pole parts of the magnet gear 31a causes the magnet gear 31a to rotate in the direction of arrow A2 to maintain the attracting state as the planar magnet moves up in the direction of arrow A1. The rotation of the magnet gear 31a caused by the elevation of the planar magnet is performed with a constant attractive force being maintained because there is no change in the distance between the magnetic poles, i.e., the distance between the planar magnet and each magnet gear 31a. When the planar magnet moves down in a direction opposite to the one indicated by arrow A1, the magnet gear 31a rotates in a direction opposite to the one indicated by arrow A2.

As described above, the second embodiment can offer similar advantageous effects to those offered by the first embodiment. Specifically, the clamp pins 21 are rotated by using the magnet gears 31a (or 32a) and the rotation magnets 31b (or 32b) which are the planar magnets, i.e., by magnet-type pin rotation. Thus, generation of dust can be suppressed. Further, during the pin rotation, the distance between the magnetic poles, i.e., the distance between each magnet gear 31a (or 32a) and the rotation magnet 31b (or 32b) is maintained to be constant. Thus, the clamp pins 21 can be rotated evenly, preventing the substrate W from being offset from its predetermined position when clamped.

In the first and second embodiments, power of clamping the substrate W is determined by the magnetic force or the spring force (power with which the clamp springs 35 push down the up-and-down arms 31c, 32c), and the position of clamping the substrate W is determined by the height at which the up-and-down arms 31c or 32c stop. For these reasons, it is possible to check whether the substrate W is being clamped properly or not by detecting the position of the height of the up-and-down arms 31c or 32c. By permitting half of the clamp pins 21 to be put out of operation only if it has been checked that the substrate W is being clamped properly, troubles can be prevented, such as displacement of the substrate W caused when the substrate W is being clamped with insufficient power when the clamp pins 21 are put out of operation. Accordingly, troubles caused by performing a treatment with the substrate W being clamped with insufficient power can be prevented by having a sensor configured to detect the height of the up-and-down arms 31c or 32c or the up-and-down ring 31d or 32d and a judgment unit (the controller 7) configured to judge, based on the height detected by the sensor, whether the substrate W is being properly clamped with the clamp pins 21.

In addition, although a disc-shaped substrate such as a circular wafer is used as the substrate W to be subjected to treatments in the first or second embodiment, the shape of the substrate W is not limited. For example, the substrate W to be subjected to treatments may be a rectangular glass substrate, such as a liquid crystal panel. This case also requires at least three clamp pins 21. It is however preferable to have four clamp pins 21 to improve the stability of clamping the substrate W. Furthermore, in a case where two sets of four clamp pins 21 are provided, the substrate W can be clamped by those sets alternately during treatment, as in the case described above.

Third Embodiment

Figure 11:
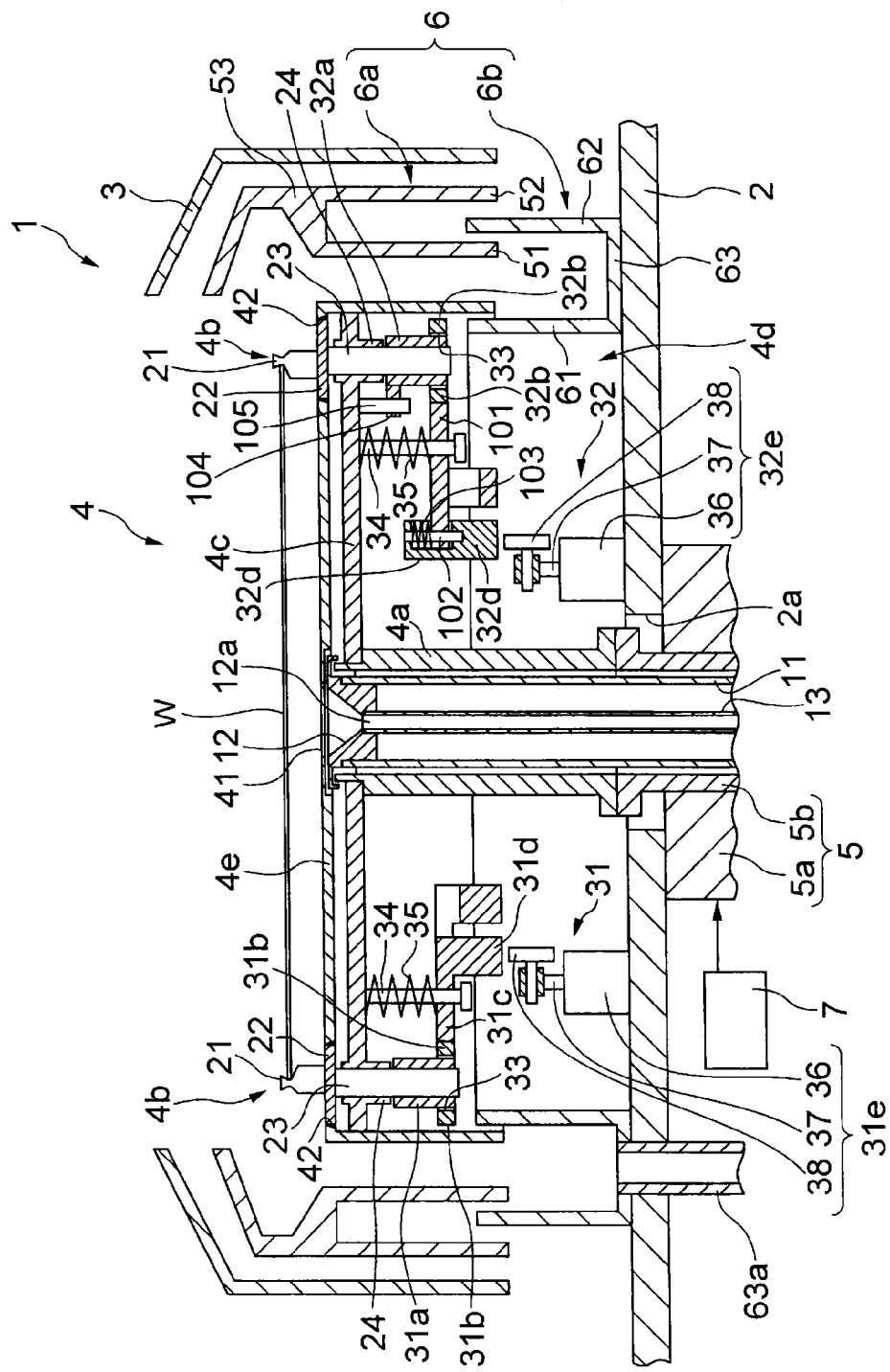
FIG. 11 is a sectional diagram showing the schematic configuration of a spin treatment apparatus according to a third embodiment.

With reference to FIG. 11, a third embodiment is described.

The third embodiment is basically the same as the first embodiment. Hence, only the difference between the first embodiment and the third embodiment (an arm movement mechanism) is described. Portions in the third embodiment that are the same as those in the first embodiment are denoted by the same reference numerals as those used in the first embodiment, and are not described again here.

As shown in FIG. 11, in a spin treatment apparatus 1 according to the third embodiment, the up-and-down arms 31c or 32c for one or two clamp pins (chuck pins) 21 are each configured as a movement up-and-down arm 101 which can move up and down independently of and in parallel with the other up-and-down arms. The movement up-and-down arm 101 is pushed by a spring 103 so as to be able to move independently of and in parallel with the other up-and-down arms along a slide shaft 102 fixed to the up-and-down ring 32d. A rotary stopper shaft 104 is fixed to the magnet gear 32a and rotates together with the magnet gear 32a. A stationary stopper shaft 105 is also provided so that the substrate W clamped by the clamp pins 21 can be positioned near the center position. The rotary stopper shaft 104 and the stationary stopper shaft 105 function as a mechanism for positioning and stopping the movement up-and-down arm 101.

By the addition of such a configuration, the magnet gear 32a can rotate and move the clamp pin 21 until the rotary stopper shaft 104 hits the stationary stopper shaft 105. Once the rotary stopper shaft 104 hits the stationary stopper shaft 105, the magnet gear 32a stops rotating so that the movement up-and-down arm 101 stops moving down. Meanwhile, the other up-and-down arms keep moving down to rotate the magnet gears 32a. Thus, the substrate W is pushed by the other clamp pins 21 at the position determined by the stopped clamp pin 21. Addition of this mechanism allows the substrate W to be placed at a predetermined position. Note that such a mechanism can be installed for one clamp pin 21 or two clamp pins 21 not opposed to each other with the substrate W in between.

As described above, the third embodiment can offer similar advantageous effects to those offered by the first embodiment. Moreover, the addition of the mechanism according to the third embodiment enables the substrate W to be positioned more precisely, so that the substrate W can be reliably prevented from being displaced when clamped.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A spin treatment apparatus that performs a treatment while rotating a substrate, the spin treatment apparatus comprising:
    at least three clamp pins configured to come into contact with an outer peripheral surface of the substrate and clamp the substrate;
    a plurality of rotatable pin rotators provided for respective clamp pins and each configured to retain a corresponding clamp pin at a position offset from a rotation axis of the pin rotator which is parallel with a rotation axis of the substrate;
    a plurality of magnet gears provided for respective pin rotators around outer peripheral surfaces thereof and each having a magnetic-pole part formed spirally along the rotation axis of the pin rotator;
    a plurality of rotation magnets provided for respective magnet gears and positioned so as to attract and be attracted by the magnetic-pole part of a corresponding magnet gear; and
    a movement mechanism configured to move the plurality of rotation magnets in a direction of the rotation axes of the pin rotators.

2. The spin treatment apparatus according to claim 1, wherein
    the movement mechanism includes
        a retainer configured to retain the plurality of rotation magnets and to move in the direction of the rotation axes of the pin rotators, and
        an up-and-down mechanism configured to move the retainer in the direction of the rotation axes of the pin rotators.

3. The spin treatment apparatus according to claim 2, wherein
    the movement mechanism positions and stops the retainer.

4. The spin treatment apparatus according to claim 3, wherein
    six clamp pins are provided as the clamp pins, and alternate three of the six clamp pins in a peripheral direction of the substrate form one set,
    the plurality of rotation magnets are provided in groups for the respective sets of the clamp pins, and
    the movement mechanism moves the plurality of rotation magnets for the sets of the clamp pins on a set-by-set basis in the direction of the rotation axes of the pin rotators.

5. The spin treatment apparatus according to claim 4, wherein
    during treatment of the substrate, the movement mechanism moves the plurality of rotation magnets for the sets of clamp pins alternately on the set-by-set basis in the direction of the rotation axes of the pin rotators.

6. The spin treatment apparatus according to claim 2, wherein
    six clamp pins are provided as the clamp pins, and alternate three of the six clamp pins in a peripheral direction of the substrate form one set,
    the plurality of rotation magnets are provided in groups for the respective sets of the clamp pins, and
    the movement mechanism moves the plurality of rotation magnets for the sets of the clamp pins on a set-by-set basis in the direction of the rotation axes of the pin rotators.

7. The spin treatment apparatus according to claim 6, wherein
    during treatment of the substrate, the movement mechanism moves the plurality of rotation magnets for the sets of clamp pins alternately on the set-by-set basis in the direction of the rotation axes of the pin rotators.

8. The spin treatment apparatus according to claim 1, wherein
    six clamp pins are provided as the clamp pins, and alternate three of the six clamp pins in a peripheral direction of the substrate form one set,
    the plurality of rotation magnets are provided in groups for the respective sets of the clamp pins, and
    the movement mechanism moves the plurality of rotation magnets for the sets of the clamp pins on a set-by-set basis in the direction of the rotation axes of the pin rotators.

9. The spin treatment apparatus according to claim 8, wherein
    during treatment of the substrate, the movement mechanism moves the plurality of rotation magnets for the sets of clamp pins alternately on the set-by-set basis in the direction of the rotation axes of the pin rotators.

* * * * *